US006984549B1

(12) United States Patent
Manning

(10) Patent No.: US 6,984,549 B1
(45) Date of Patent: Jan. 10, 2006

(54) METHODS OF FORMING SEMICONDUCTOR FUSE ARRANGEMENTS

(75) Inventor: H. Montgomery Manning, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/922,492

(22) Filed: Aug. 19, 2004

(51) Int. Cl.
*H01L 21/82* (2006.01)

(52) U.S. Cl. ....................................... 438/132; 438/601

(58) Field of Classification Search ................ 438/132, 438/529, 601
See application file for complete search history.

(56) References Cited

U.S. PATENT DOCUMENTS 5,442,282 A 8/1995 Rostoker
6,300,233 B1 * 10/2001 Lee et al. .................. 438/601

* cited by examiner

*Primary Examiner*—Jennifer Kennedy
*Assistant Examiner*—Kyoung Lee
(74) *Attorney, Agent, or Firm*—Wells St. John P.S.

(57) ABSTRACT

The invention includes semiconductor fuse arrangements containing an electrically conductive plate over and in electrical contact with a plurality of electrically conductive links. Each of the links contacts the electrically conductive plate as a separate region relative to the other links, and the region where a link makes contact to the electrically conductive plate is a fuse. The invention also includes methods of forming semiconductor fuse arrangements.

28 Claims, 10 Drawing Sheets

METHODS OF FORMING SEMICONDUCTOR FUSE ARRANGEMENTS

TECHNICAL FIELD

The invention pertains to semiconductor fuse arrangements, and to methods of forming semiconductor fuse arrangements.

BACKGROUND OF THE INVENTION

Fuses are commonly incorporated into semiconductor constructions. The fuses are typically provided as fuse "links", which are narrow lines in a patterned conductive layer. The links are arranged in vectors or arrays, with the separation between the fuses being determined by, among other things, the spot size achievable by an energy input device (such as, for example, a laser) utilized to heat up and blow the fuses, as well as by the positional accuracy of the energy input device.

An exemplary fuse arrangement is shown in a semiconductor construction 10 of FIG. 1. The construction 10 comprises a substrate 12 and a plurality of electrical interconnects 14, 16, 18, 20, 22 and 24 provided across a surface of the substrate. The interconnects have fuses 26, 28, 30, 32, 34 and 36 associated therewith.

The fuses are separated from one another by a sufficient distance so that each fuse can be individually blown by energy from an energy input device. Additionally, the fuses are provided to be a sufficient distance from adjacent interconnects so that the adjacent interconnects are not adversely affected when a fuse is blown.

The fuses are typically grouped into one or more one-dimensional arrays (exemplary arrays are shown in construction 10, with one array being fuses 26, 28 and 30, and another being fuses 32, 34 and 36), and such arrays can be referred to as fuse "banks". Each fuse bank has a footprint associated therewith, which corresponds to the amount of semiconductor real estate that must be set aside for the fuse bank. A continuing goal of semiconductor device processing is to increase the density of devices formed across a semiconductor substrate. Accordingly, it is a goal to reduce the footprint associated with fuse banks so that semiconductor real estate can be freed up for utilization in other devices.

A problem associated with the fuse bank arrangement of FIG. 1, in addition to the large amount of real estate consumed by the one-dimensional arrays of fuses, arises from the difficulty of exposing the fuses to sufficient energy to blow the fuses. Specifically, the fuses are formed at a common elevational level with the conductive interconnects 14, 16, 18, 20, 22 and 24. Typically, such conductive interconnects would be buried beneath several levels of dielectric material, and beneath a passivation layer capping the other levels of dielectric material. However, it can be difficult to provide sufficient energy through all the layers of dielectric material to consistently blow the fuses. Accordingly, it is common to etch a window over the fuses so that energy can be provided to blow the fuses. The etching of the window adds additional process steps to semiconductor fabrication, and generally it is desired to reduce the number of processing steps in order to increase throughput and reduce costs associated with a fabrication process. Additionally, the window can provide an avenue through which contaminants can undesirably migrate into a semiconductor construction.

For the above-described reasons, it is desirable to develop new arrangements of fuses for semiconductor constructions, and to develop methods of forming such arrangements.

SUMMARY OF THE INVENTION

In one aspect, the invention encompasses a method of forming a semiconductor fuse arrangement. A semiconductor substrate is provided, and a first elevational level is defined over the substrate. A plurality of electrically conductive interconnects is provided, with such interconnects having contact surfaces at or beneath the first elevational level. A plurality of electrically conductive links are formed to extend upwardly from the contact surfaces of the electrically conductive interconnects. An electrically conductive plate is formed over the links and in electrical contact with the links. The conductive plate is formed to be above the first elevational level. Individual links contacting the conductive plate at separate regions relative to other links. The region where a link makes contact with the electrically conductive plate is a fuse, and the interconnections of the electrically conductive plate with the upwardly extending links is thus an arrangement of fuses.

The invention also includes particular semiconductor fuse arrangements.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
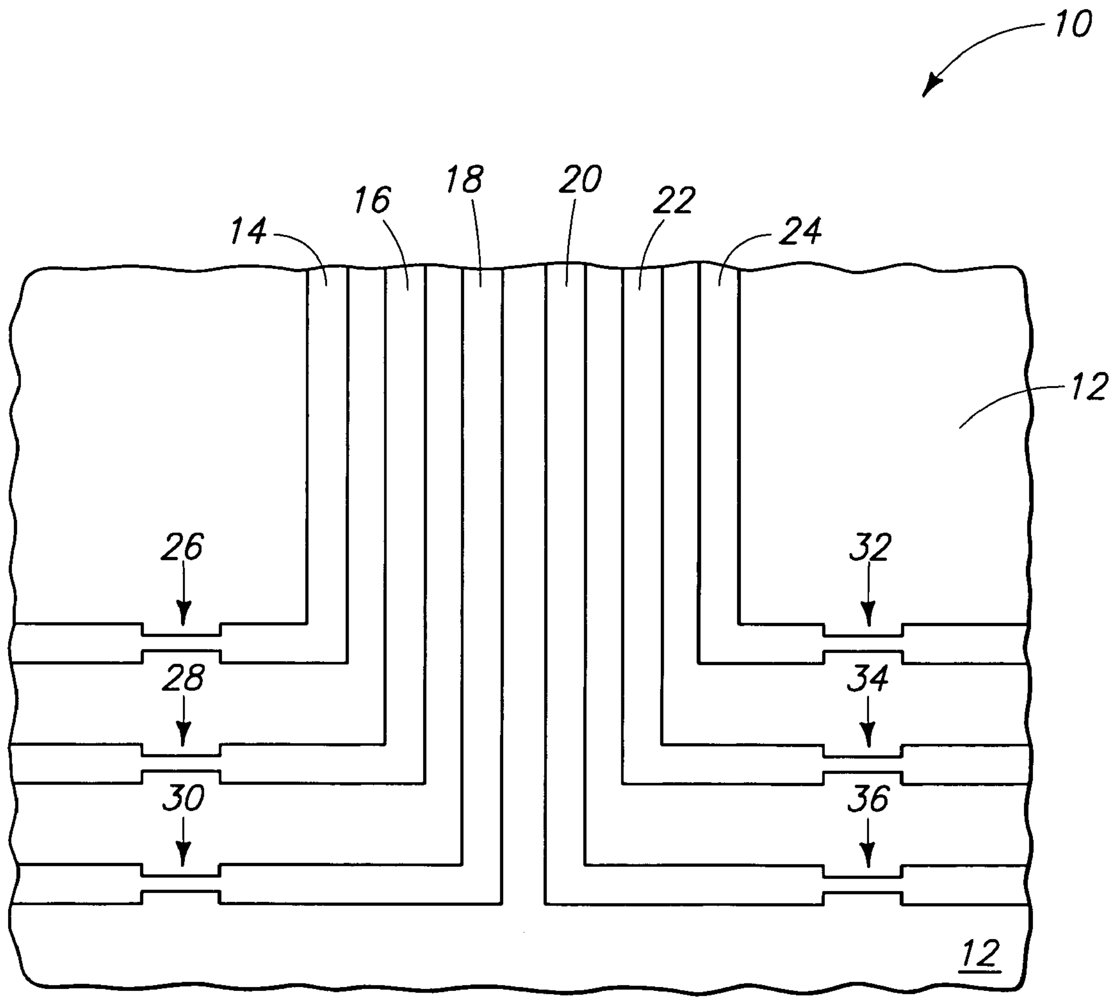
FIG. 1 is a fragmentary, diagrammatic top view of a prior art semiconductor fuse arrangement.

One aspect of the present invention is a recognition that semiconductor real estate can be conserved if fuses are formed in a stacked or three-dimensional array, rather than the prior art one-dimensional array described in FIG. 1. An exemplary semiconductor fuse arrangement of the present invention is described with reference to a semiconductor construction 100 in FIGS. 2 and 3. Construction 100 comprises a semiconductor substrate 102 and a plurality of conductive interconnects 104, 106, 108, 110, 112, 114, 116, 118 and 120 over the substrate.

The substrate 102 can comprise any suitable semiconductor material or combination of materials, and although shown as a homogeneous composition can comprise various layers and circuit devices as will be recognized by persons of ordinary skill in the art. In particular aspects, substrate 102 can comprise a monocrystalline silicon wafer. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 3:
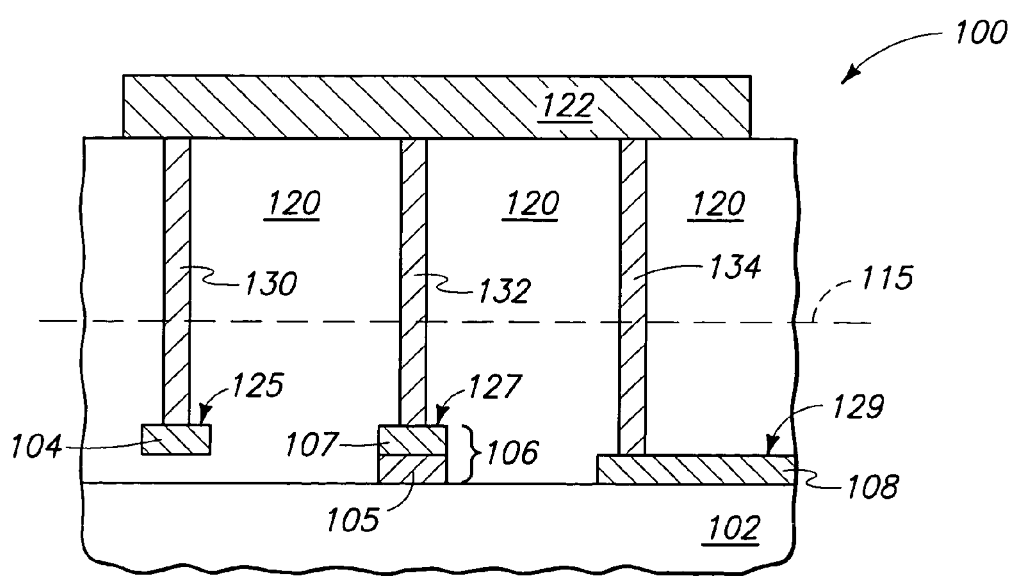
FIG. 3 is a fragmentary, diagrammatic cross-sectional side view along the line 3—3 of FIG. 2.

Interconnects 104, 106, 108, 110, 112, 114, 116, 118 and 120 can comprise any suitable electrically conductive materials or combinations of materials. The interconnects can be formed directly on a surface of substrate 102, or can be spaced from the substrate by intervening materials. FIG. 3 shows three of the interconnects (104, 106 and 108) and illustrates some of the diversity that can exist amongst the interconnects. For instance, interconnect 104 is spaced from an upper surface of substrate 102 by an intervening material, whereas interconnects 106 and 108 are directly against an upper surface of substrate 102. Further, interconnect 106 comprises a stack of two different materials 105 and 107, whereas interconnect 108 is shown to comprise a single material. The conductive materials utilized in the interconnects can comprise, for example, various metals, metal compounds, and/or conductively-doped semiconductor materials such as, for example, conductively-doped silicon.

The interconnects have contact surfaces which will ultimately be utilized for forming contact to electrically conductive links. For instance, the interconnects 104, 106 and 108 of FIG. 3 have upper surfaces 125, 127 and 129, respectively, which can be considered contact surfaces. The contact surfaces of the various interconnects can be at various elevational levels relative to the upper surface of 102 and relative to one another. For purposes of explaining the invention herein, it is useful to define a first elevational level over substrate 102 as being a level which is elevationally equal to or above the elevational level of all of the contact surfaces of the various interconnects. An exemplary defined first elevational level is shown in FIG. 3 by dashed-line 115.

An insulative material 120 is over substrate 102 and over the contact surfaces of the various interconnects. Insulative material 120 can comprise any suitable composition or combination of compositions. In particular aspects, insulative material 120 can comprise one or more of silicon dioxide, silicon nitride, borophosphosilicate glass (BPSG) and spin-on dielectrics. Although insulative material 120 is shown to be homogeneous in composition, it is to be understood that the insulative material can comprise a stack of various compositions in some aspects of the invention.

An electrically conductive plate 122 is formed over insulative material 120. Plate 122 can comprise any suitable electrically conductive composition or combination of compositions. For instance, the electrically conductive plate can, in some aspects, comprise, consist essentially of, or consist of one or more of aluminum, copper, gold, silver, tungsten, titanium and silicon. In particular aspects, the electrically conductive plate can comprise, consist essentially of, or consist of one or more of titanium nitride, tungsten nitride and conductive metal silicide. The electrically conductive plate can have any suitable thickness, and in particular aspects will have a thickness of, for example, from about 10 Å to about 10,000 Å. Although the plate 122 is shown to be homogeneous in composition, it is to be understood that the plate can comprise a stack of two or more different conductive compositions in various aspects of the invention. The shown plate is directly above portions of the interconnects comprising the contact surfaces, rather than being laterally offset relative to such portions of the interconnects.

A plurality of electrically conductive links 130, 132, 134, 136, 138, 140, 142, 144 and 146 extend upwardly from the contact surfaces of interconnects 104, 106, 108, 110, 112, 114, 116, 118 and 120, respectively, to electrically connect with electrically conductive plate 122. In the aspect of the invention shown in FIG. 3, the electrically conductive links physically contact a lowermost surface of electrically conductive plate 122.

The electrically conductive links 130, 132, 134, 136, 138, 140, 142, 144 and 146 can comprise any suitable electrically conductive material or combination of materials. In particular aspects, the links can comprise the same conductive material as is utilized for conductive plate 122, and in other aspects the links can comprise different materials from those utilized in plate 122. Also, the links can comprise the same composition as one another, or various of the links can comprise a different composition than others of the links. Although the links are shown to comprise a homogeneous composition throughout their entirety in FIG. 3, it is to be understood that the links can also comprise stacks of different compositions in various aspects of the invention.

Each of the shown links contacts the electrically conductive plate 122 at a different location than the other links. The region where a link makes contact to the electrically conductive plate is a fuse, and accordingly the interconnections of the electrically conductive plate with the upwardly extending links is a fuse arrangement. The particular fuse arrangement of construction 100 can be understood with reference to FIG. 2 where each fuse corresponds to a region where the shown conductive links are contacting the electrically conductive plate 122. The conductive links 130, 132, 134, 136, 138, 140, 142, 144 and 146 are shown in dashed-line view in FIG. 2, as are portions of interconnects 104, 106, 108, 110, 112, 114, 116, 118 and 120, to indicate that the conductive links and the portions of the interconnects are beneath the conductive plate 122 in the view of FIG. 2.

Plate 122 comprises an interconnect region 150 which extends to other circuitry 152 which is external of the shown fragment of construction 100. Accordingly, the conductive links 130, 132, 134, 136, 138, 140, 142, 144 and 146 electrically connect the underlying interconnects 104, 106, 108, 110, 112, 114, 116, 118 and 120 to the circuitry of 152 through electrically conductive plate 122.

Figure 2:
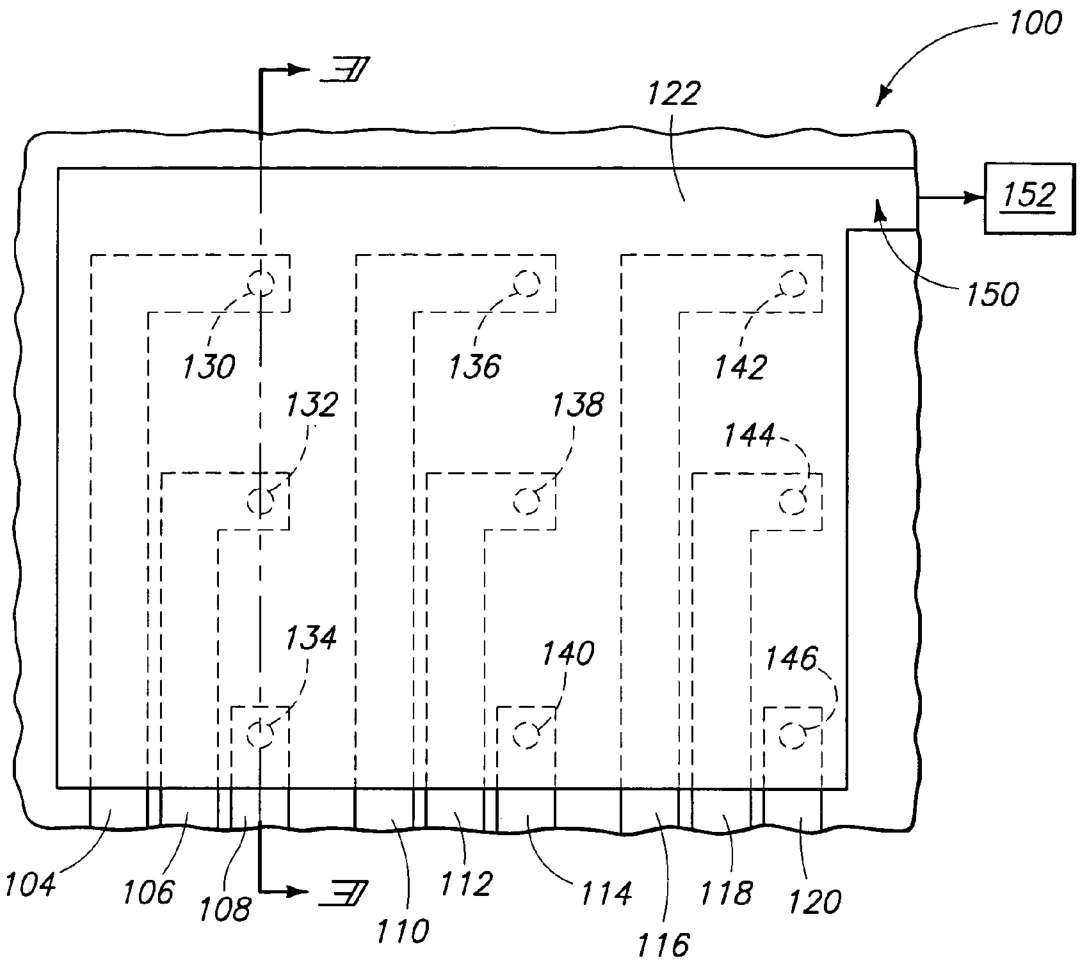
FIG. 2 is a fragmentary, diagrammatic top view of a semiconductor fuse arrangement in accordance with an aspect of the present invention.

In operation, fuses associated with the construction 100 of FIGS. 2 and 3 are blown by disrupting material of plate 122 and/or the conductive links associated with the fuses. The disruption of the material can comprise, for example, one or both of melting the material and vaporizing the material. In particular aspects, a fuse blow can entail laser ablation and/or heating of the fuse material.

Figure 4:
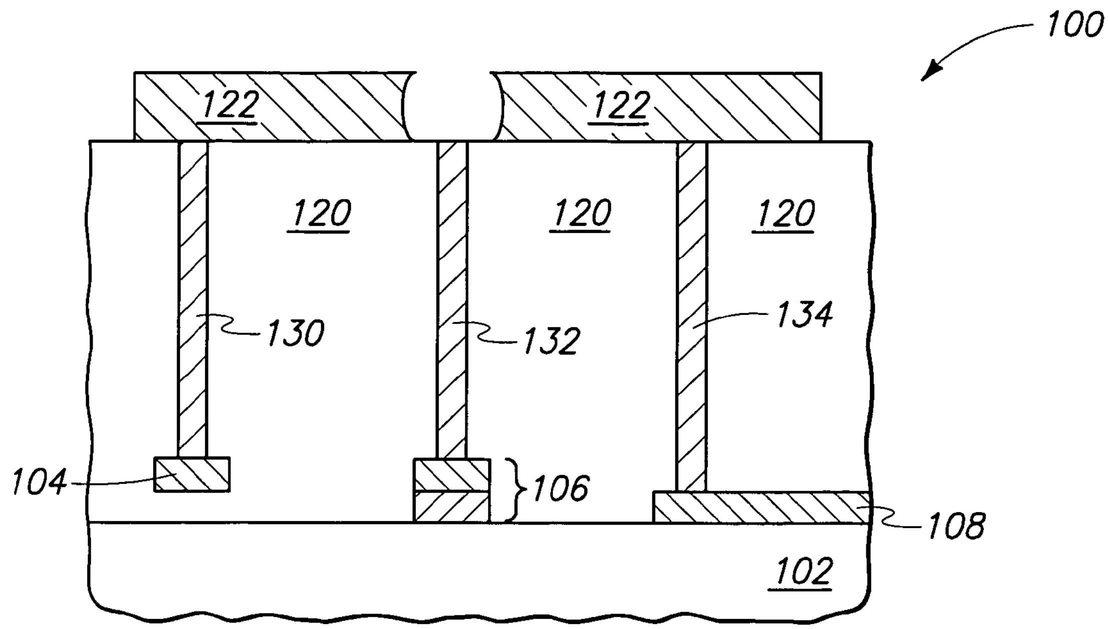
FIG. 4 is a view of the FIG. 3 fragment shown after a fuse is blown in accordance with an aspect of the present invention.
Figure 5:
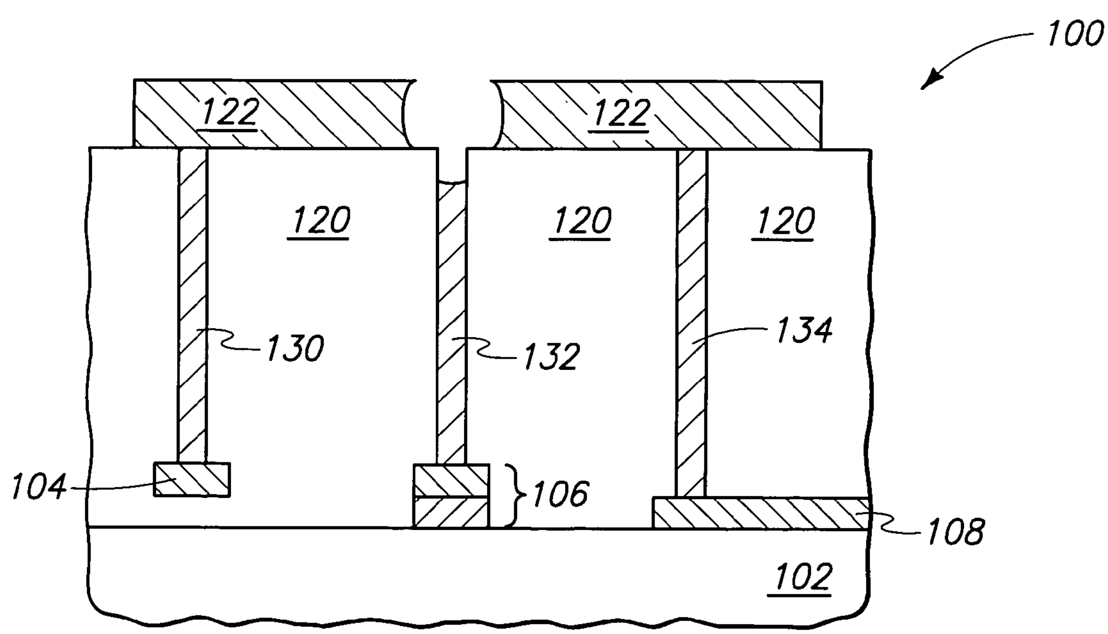
FIG. 5 is a view of the FIG. 3 fragment shown after a fuse is blown in accordance with another aspect of the invention.

An exemplary fuse blow is illustrated in FIG. 4, which shows conductive plate 122 disrupted over conductive link 132 so that there is no longer an electrically conductive interconnection between the conductive link and the conductive plate. FIG. 5 illustrates another exemplary fuse blow event, and specifically shows an event which has disrupted material of both the plate 122 and the conductive link 132 to break the electrical connection between the link and the electrically conductive plate. The FIG. 5 aspect of the invention can occur in constructions in which plate 122 and conductive link 132 comprise the same composition as one another, as well as in constructions in which the plate and link comprise different compositions from one another. For instance, plate 122 can be considered to comprise a first conductive material and link 132 considered to comprise a second conductive material, and the blowing of the fuse can be considered to disrupt both of the first and second conductive materials.

The amount of energy utilized to blow a fuse can depend on the materials of plate 122 and the conductive links, and on whether it is desired to disrupt only the material of the plate, only the material of a conductive link, or to disrupt both the material of the plate and the material of the conductive link. If a substantial amount of energy is to be utilized to blow a fuse, it can be advantageous to form some of the materials underlying fuse banks of the present invention from tungsten in that tungsten can handle relatively high temperatures before damage occurs.

An exemplary process for forming the construction of FIGS. 2 and 3 is described with reference to FIGS. 6–9. In referring to FIGS. 6–9, similar numbering will be used as was utilized above in describing FIGS. 2 and 3.

Figure 6:
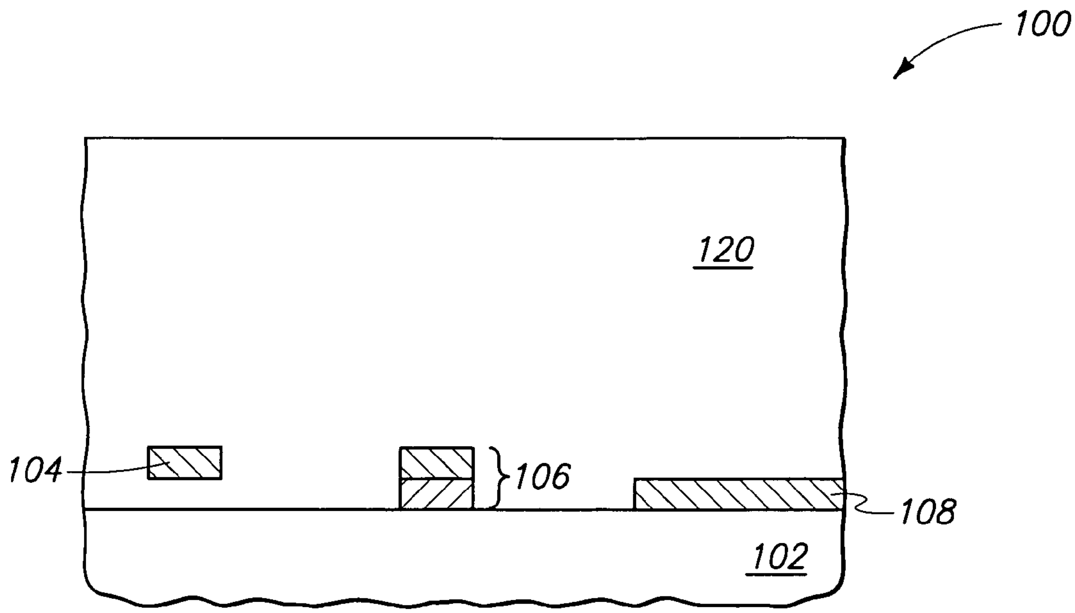
FIG. 6 is a diagrammatic, cross-sectional side view of a semiconductor wafer fragment illustrating a preliminary stage of an exemplary method for forming the FIG. 3 construction.

Referring initially to FIG. 6, construction 100 is shown at a preliminary processing stage. The construction comprises the substrate 102, the interconnects 104, 106 and 108, and the dielectric material 120.

Figure 7:
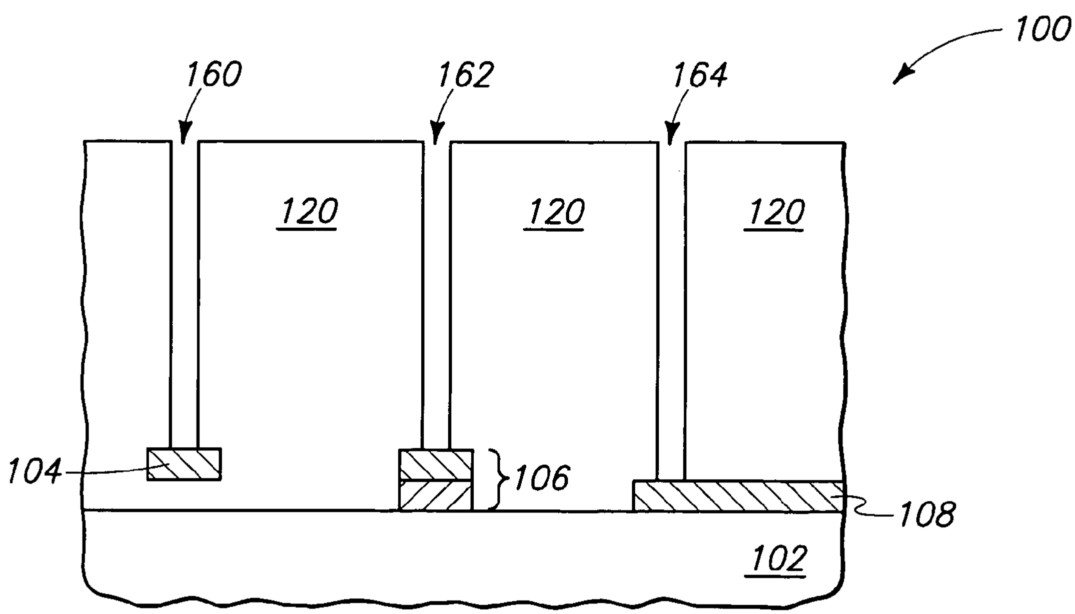
FIG. 7 is a view of the FIG. 6 wafer fragment shown at a processing stage subsequent to that of FIG. 6.

Referring next to FIG. 7, openings 160, 162 and 164 are formed through insulative material 120 and to the upper contact surfaces of interconnects 104, 106 and 108, respectively. The openings can be formed by any suitable method, including, for example, photolithographically forming a patterned mask (not shown) over dielectric material 120, transferring a pattern from the mask to the dielectric material 120 with a suitable etch, and subsequently removing the mask to leave the construction of FIG. 7.

Figure 8:
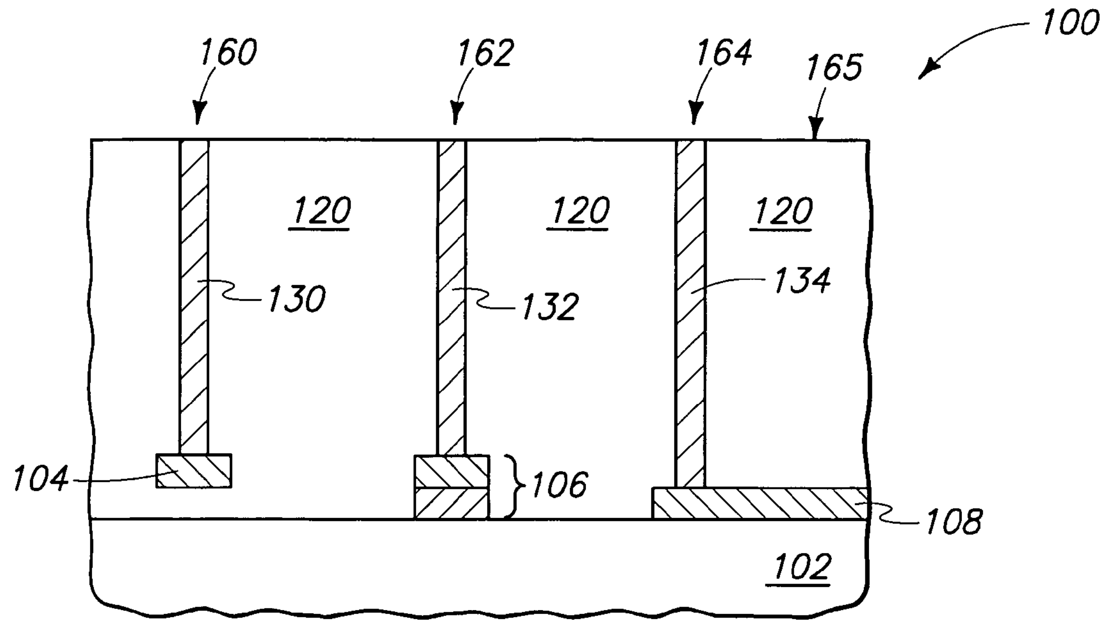
FIG. 8 is a view of the FIG. 6 wafer fragment shown at a processing stage subsequent to that of FIG. 7.

Referring next to FIG. 8, conductive material is formed within the openings 160, 162 and 164 to form the interconnects 130, 132 and 134. The construction of FIG. 8 can be formed by, for example, initially providing the conductive material within the openings 160, 162 and 164, as well as over the uppermost surface of insulative material 120; and subsequently removing the conductive material from over the uppermost surface of insulative material 120 with suitable planarization, such as, for example, chemical-mechanical polishing. The planarization forms a planarized upper surface 165 comprising the upper surfaces of insulative material 120 and conductive links 130, 132 and 134.

Figure 9:
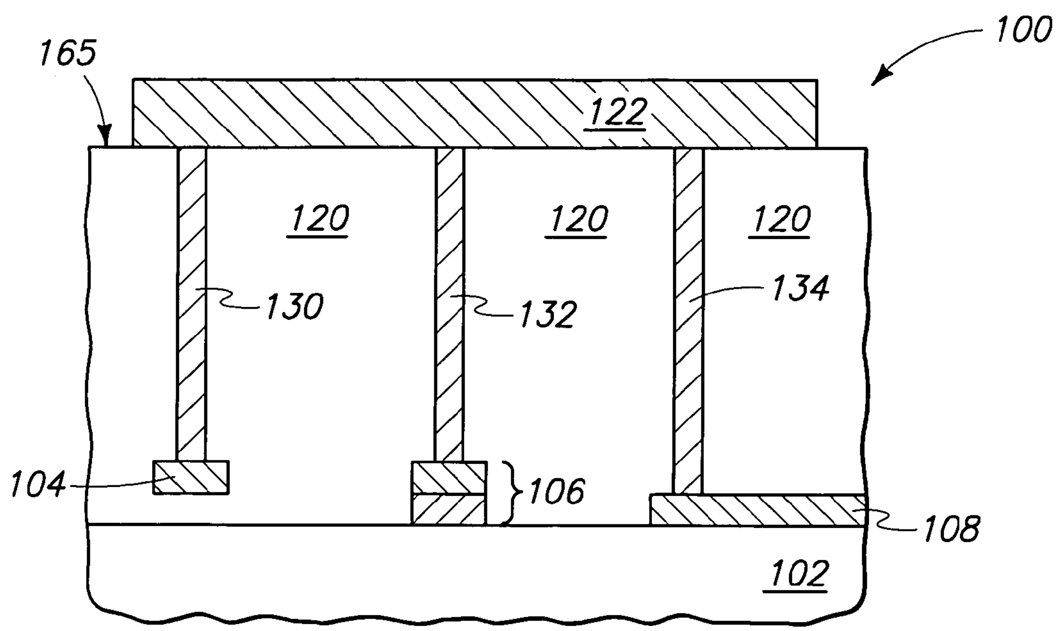
FIG. 9 is a view of the FIG. 6 wafer fragment shown at a processing stage subsequent to that of FIG. 8, and is identical to FIG. 3.

Referring next to FIG. 9, conductive plate 122 is formed over planarized surface 165. The conductive plate can be formed in a desired pattern by, for example, forming material of the conductive plate over an entirety of the surface of insulative material 120, forming a photolithographically patterned mask over the material of the conductive plate, transferring a pattern from the mask to the underlying conductive plate material with a suitable etch, and subsequently removing the mask to leave the construction shown in FIG. 9. The construction of FIG. 9 is identical to the construction described previously with reference to FIG. 3.

Figure 10:
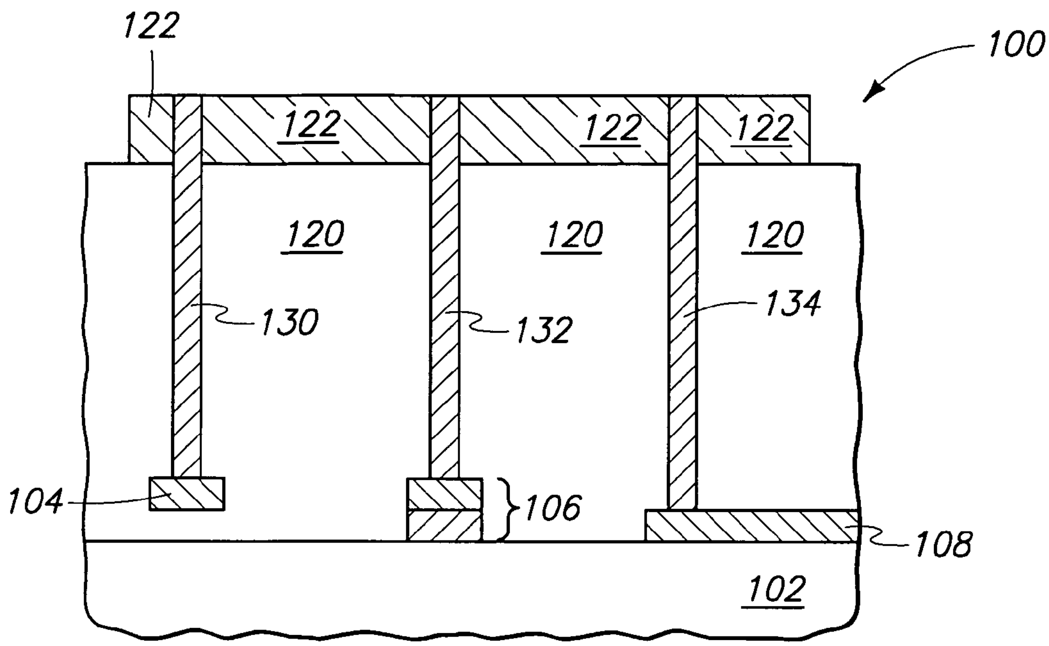
FIG. 10 is a diagrammatic, cross-sectional view of a semiconductor wafer fragment illustrating a construction alternative to that of FIG. 3.

FIG. 10 illustrates an aspect of the invention alternative to that of FIG. 3. In referring to FIG. 10, similar numbering will be used as was utilized above in describing FIG. 3. The construction of FIG. 10 is similar to that of FIG. 3 in that the construction comprises the insulative material 120, conductive interconnects 104, 106 and 108, and substrate 102 described previously with respect to FIG. 3. The construction of FIG. 10 also comprises the conductive links 130, 132 and 134, and the conductive plate 122 similar to the links and conductive plate of FIG. 3. However, in contrast to the construction of FIG. 3, the conductive links of FIG. 10 extend through the conductive plate 122.

An exemplary method for forming the construction of FIG. 10 is described with reference to FIGS. 11–13.

Figure 11:
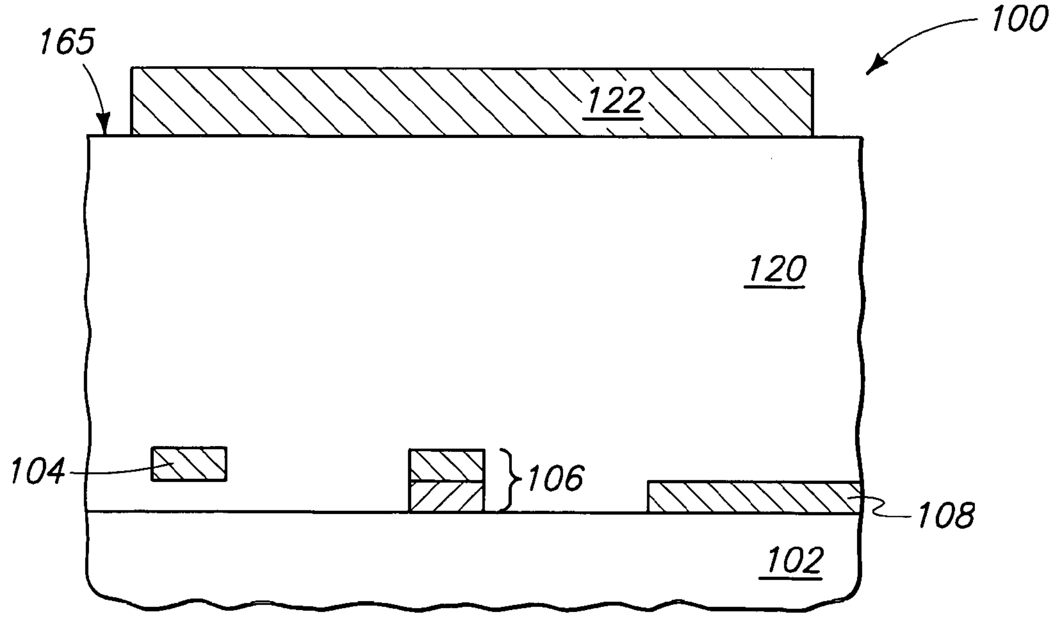
FIG. 11 is a view of a wafer fragment shown at a preliminary processing stage of a method which can be utilized for forming the FIG. 10 construction.

Referring to FIG. 11, construction 100 is illustrated at a preliminary processing stage in which conductive plate 122 is provided over insulative material 120.

Figure 12:
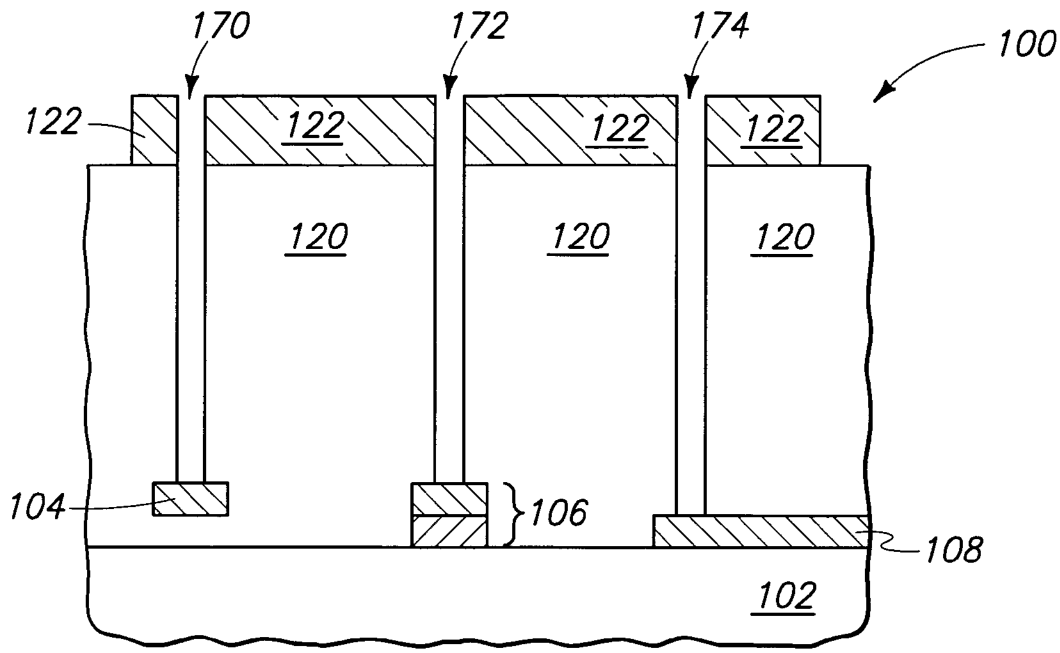
FIG. 12 is a view of the FIG. 11 fragment shown at a processing stage subsequent to that of FIG. 11.

FIG. 12 shows the construction 100 after openings 170, 172 and 174 are formed through conductive plate 122 and insulative material 120. The openings 170, 172 and 174 extend to contact surfaces of interconnects 104, 106 and 108, respectively.

Figure 13:
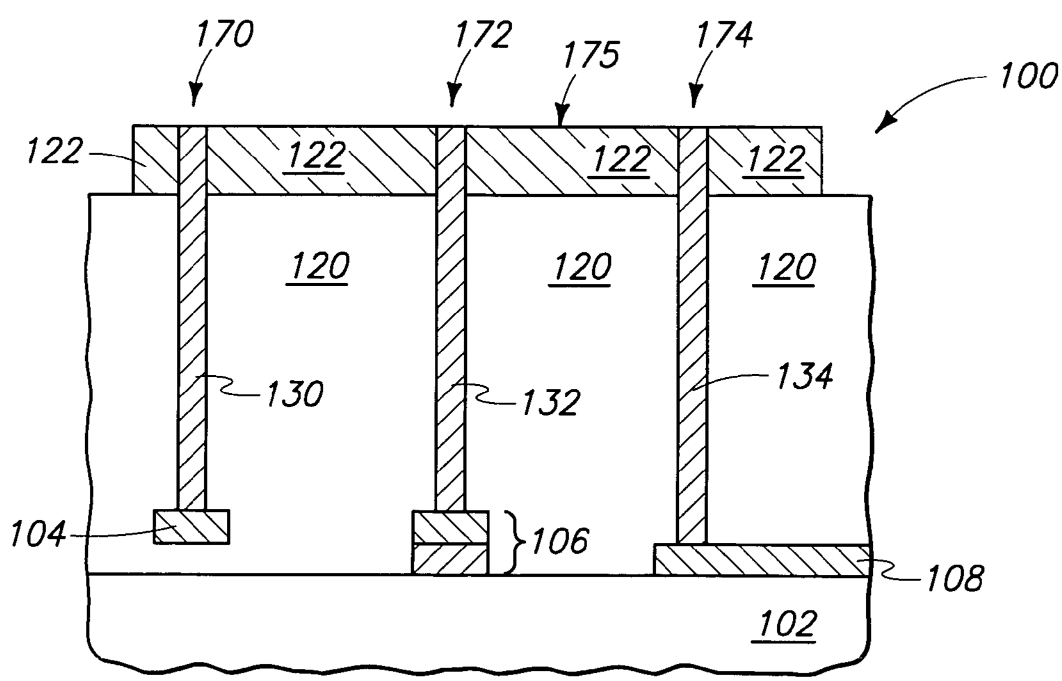
FIG. 13 is a view of the FIG. 11 wafer fragment shown at a processing stage subsequent to that of FIG. 12, and is identical to FIG. 10.

FIG. 13 shows conductive material provided within the openings to form conductive links 130, 132 and 134. The construction of FIG. 13 can be formed by providing a conductive material within openings 170, 172 and 174, as well as over conductive plate 122; and subsequently planarizing the conductive material to remove the material from over plate 122 and form the shown planarized upper surface 175 extending across interconnects 130, 132 and 134 as well as across conductive plate 122. The invention encompasses other aspects (not shown) in which the conductive material utilized to form the links 130, 132 and 134 is left over the conductive plate and effectively becomes part of the conductive plate. The construction of FIG. 13 is identical to the construction of FIG. 10 described previously.

Although the methodology of FIGS. 11–13 comprises patterning conductive plate 122 prior to forming the openings 170, 172 and 174 extending through the conductive plate, it is to be understood that the invention encompasses other aspects (not shown) in which the openings are formed prior to the patterning of the conductive plate into the desired final shape.

Figure 14:
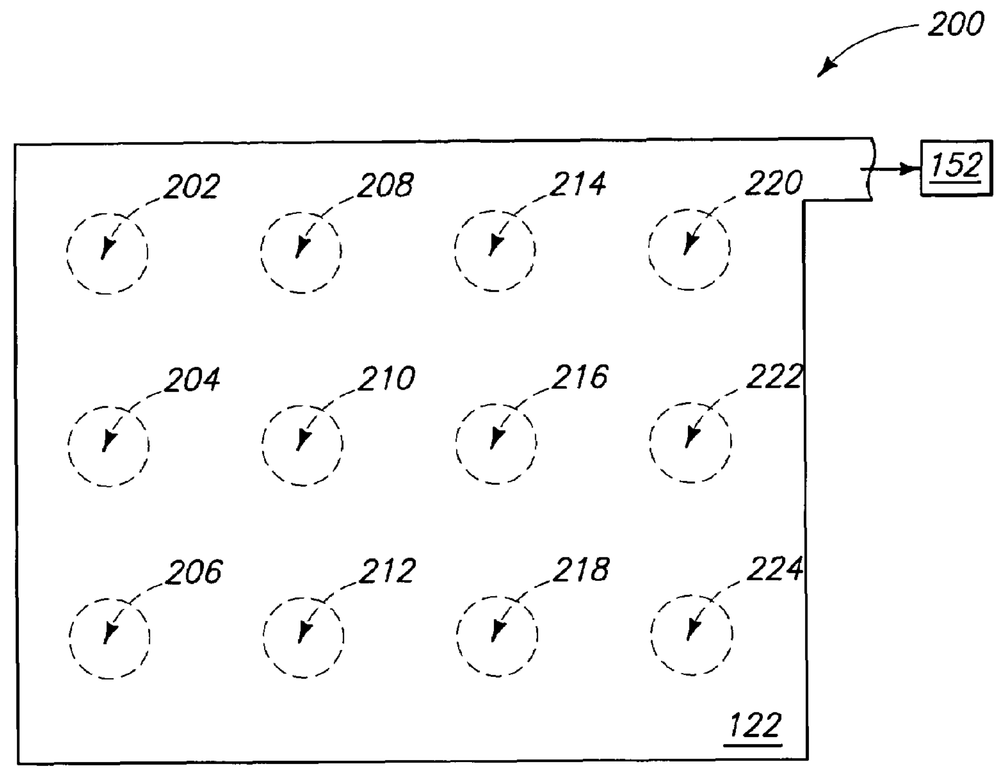
FIG. 14 is a diagrammatic top view of an exemplary fuse arrangement.
Figure 15:
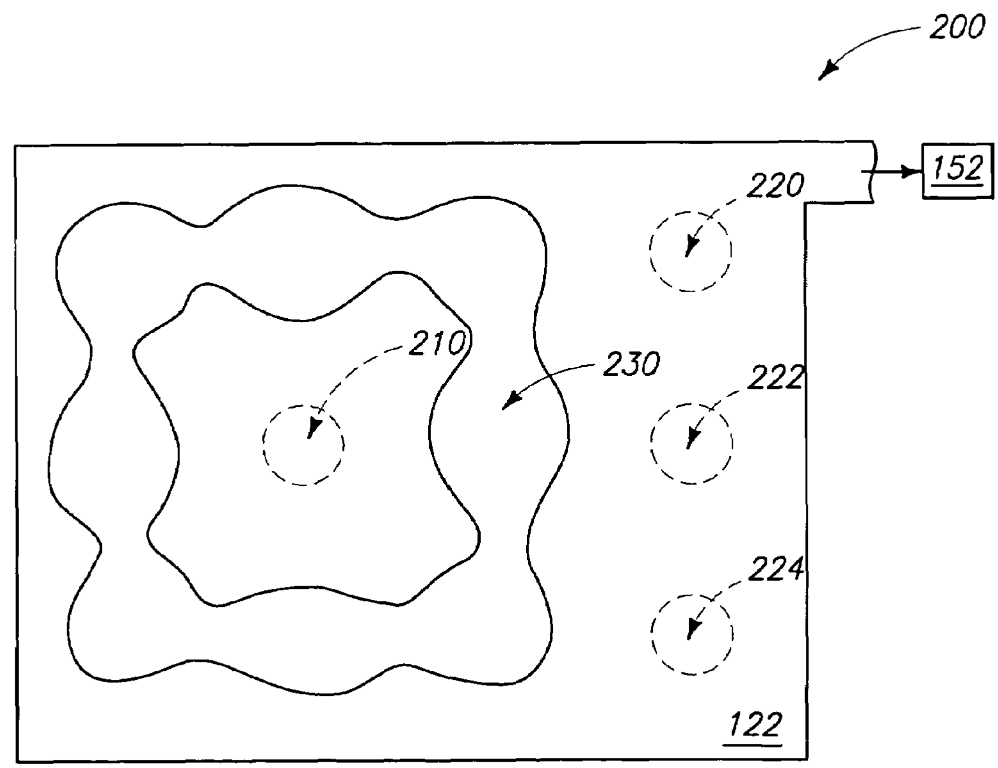
FIG. 15 is a view of the FIG. 14 fuse arrangement shown after some of the fuses are blown, and illustrates a problem which can occur when utilizing the FIG. 14 arrangement.

One potential problem with the fuse arrangements of the present invention can be that if all of the fuses surrounding a fuse are blown, the surrounded fuse can become an electrically isolated island. Such is illustrated in FIGS. 14 and 15 with reference to a construction 200. Specifically, FIG. 14 shows a fuse arrangement comprising an array of fuses 202, 204, 206, 208, 210, 212, 214, 216, 218, 220, 222 and 224 associated with a conductive plate 122. FIG. 15 shows the construction 200 after the fuses 202, 204, 206, 208, 212, 214, 216 and 218 (FIG. 14) are blown. The blown fuses create an opening 230 within plate 122 which surrounds remaining fuse 210, and effectively electrically isolates the fuse 210 from the circuitry 152 external of conductive plate 122.

Figure 16:
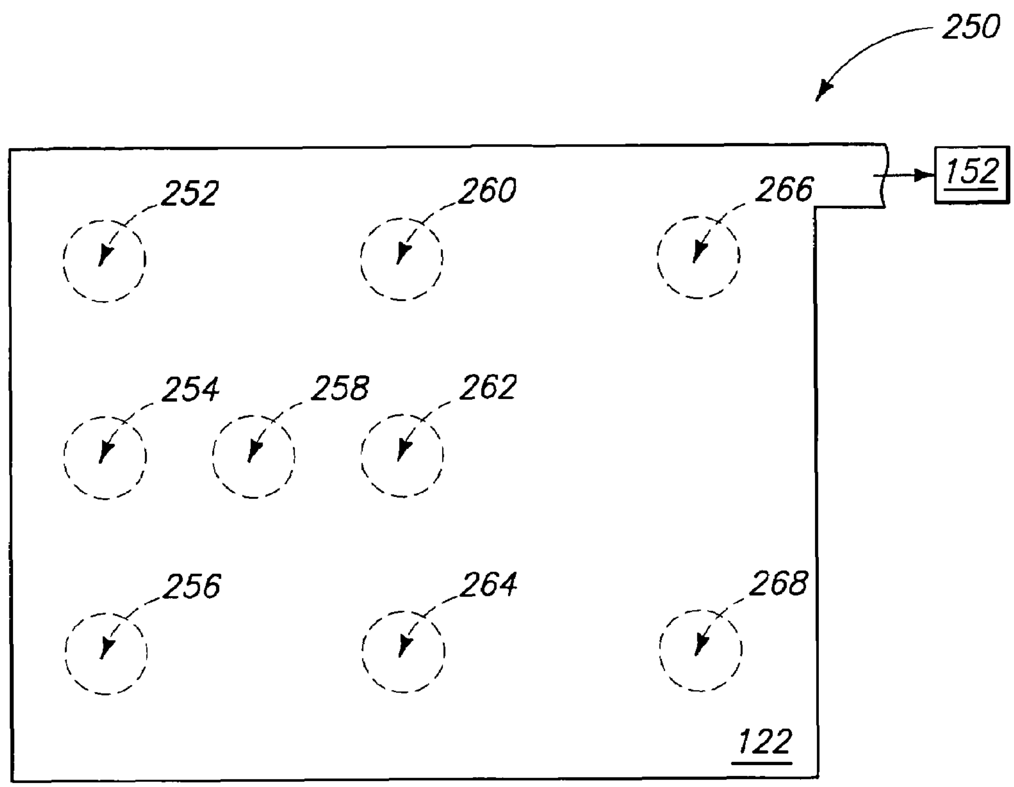
FIG. 16 is a view of a semiconductor fuse arrangement which is alternative to that of FIG. 14, and which can avoid the problem illustrated in FIG. 15.

FIG. 16 illustrates a fuse arrangement which can avoid the problem discussed above with reference to FIGS. 14 and 15. Specifically, FIG. 16 shows a construction 250 comprising an array of fuses 252, 254, 256, 258, 260, 262, 264, 266 and 268. The fuses of construction 250 are arranged such that no fuse becomes electrically isolated when its neighboring fuses are blown. In other words, the particular fuses of construction 250 are staggered relative to one another and spaced so that the fuses retain an electrical connection to the circuitry 152 external of plate 122 even when all of their neighboring fuses have been blown.

Figure 17:
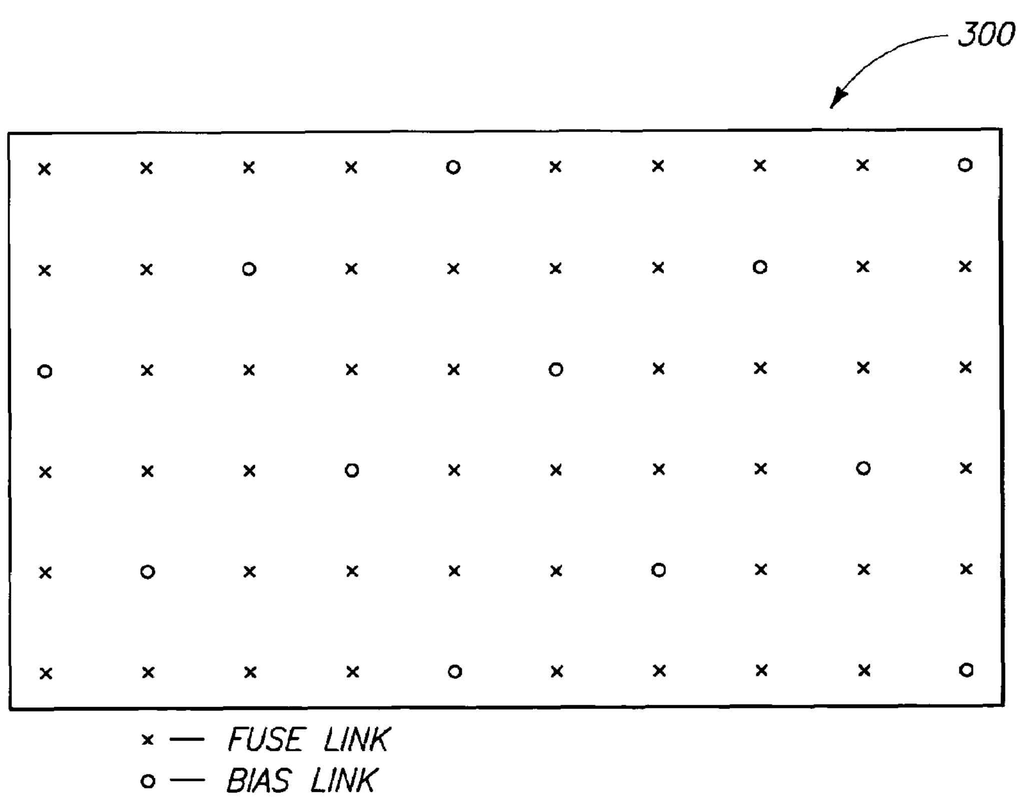
FIG. 17 is a view of a semiconductor fuse arrangement which is alternative to that of FIG. 14, and which can avoid the problem illustrated in FIG. 15.
Figure 18:
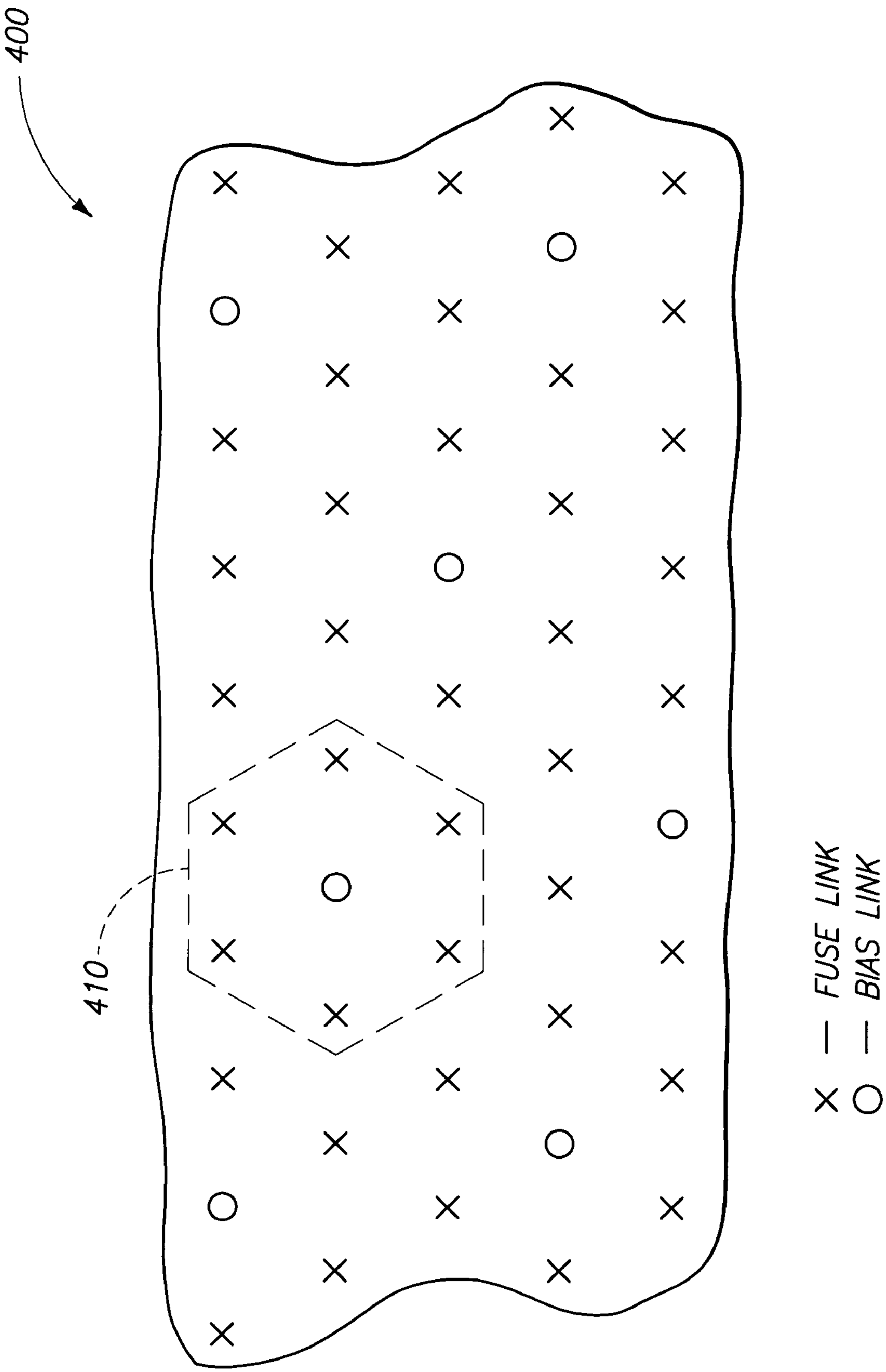
FIG. 18 is a view of a semiconductor fuse arrangement which is alternative to that of FIG. 14, and which can avoid the problem illustrated in FIG. 15.

Another arrangement which can avoid the problem discussed above with reference to FIGS. 14 and 15 is an arrangement having one or more fuse links (such as one or more of the links 202, 204, 206, 208, 210, 212, 214, 216, 218, 220, 222 and 224 of FIG. 14) providing bias to the fuse plate (such as the plate 122 of FIG. 14), in addition to, or alternatively to, the shown connection 152 of FIG. 14. FIGS. 17 and 18 illustrate exemplary arrangements configured so that various fuse links provide bias to a fuse plate in configurations such that no fuse should become electrically isolated through the blowing of its neighboring fuses. The fuse links shown in FIGS. 17 and 18 are designated by the symbol “X”, and the bias links are designated by the symbol “O”. The arrangement of FIG. 18 provides a repeating hexagonal pattern 410, which may be advantageous for tightly packing fuse and bias elements.

The fuse arrangements of the present invention can offer advantages over prior art fuse arrangements in that a fuse bank of the present invention can be formed over less semiconductor real estate than a comparable fuse bank of the prior art. In particular aspects in which the conductive links between a plate (such as the plate 122) and interconnects (such as the interconnects of FIG. 3) are formed within vias (such as the vias of FIGS. 7 and 12) the conductive links can be considered to be within a “sea of vias” under a common metal plate. Such can advantageously pack the conductive links within a relatively tight area.

The fuse arrangements of the present invention can alleviate, and even prevent, the prior art problems discussed in the “Background” section of this disclosure as being associated with forming windows to prior art fuse banks. In exemplary aspects of the present invention, the metal plate 122 (FIGS. 3 and 10, for example) can be an uppermost metal material of a semiconductor construction. The fuse bank of the present invention can then be accessed without etching through multiple dielectric materials to expose the fuse bank, which can avoid the problems discussed in the “Background” section of this disclosure. In some aspects, the only layer above the metal plate of the fuse bank of the present invention is a passivation layer (i.e., the final layer formed over integrated circuitry). Accordingly, only the single passivation layer will be etched to form the window to the fuse bank of the present invention. Further, if the metal plate extends outwardly beyond the fuse bank, the passivation layer can be etched to form a window to the fuse bank without forming any openings beyond the fuse bank within which contaminants could penetrate to underlying semiconductor circuitry. Further, if the passivation layer is at least partially transparent to the energy utilized to break the fuses of the present invention, the passivation layer can be left over the fuse bank of the present invention rather than etched to form a window. Although it can be advantageous for the conductive plate 122 of a fuse box of the present invention to be the uppermost metal of a semiconductor construction, it is to be understood that the invention also includes aspects in which such conductive plate is not the uppermost metal of a semiconductor construction.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor fuse arrangement, comprising:

providing a semiconductor substrate;

defining a first elevational level over the substrate;

providing a plurality of electrically conductive interconnects having contact surfaces at or beneath the first elevational level;

forming a plurality of electrically conductive links extending upwardly from the contact surfaces of the electrically conductive interconnects; and forming an electrically conductive plate over the links and in electrical contact with the links, the conductive plate being formed to be above said first elevational level, individual links contacting the electrically conductive plate at a separate region relative to other links, the region where a link makes contact to the electrically conductive plate being a fuse, and the interconnections of the electrically conductive plate with the upwardly extending links thus being an arrangement of fuses.

2. The method of claim 1 wherein the electrically conductive plate comprises a material, and further comprising subjecting one or more of the fuses to appropriate energy to blow said one or more of the fuses, the blowing of said one or more of the fuses comprising disrupting material of the electrically conductive plate which is associated with said one or more of the fuses.

3. The method of claim 2 wherein the disrupting of the material of the electrically conductive plate comprises melting said material.

4. The method of claim 2 wherein the disrupting of the material of the electrically conductive plate comprises vaporizing said material.

5. The method of claim 1 wherein the electrically conductive plate comprises a first material and the links comprise a second material which can be the same as the first material or different from the first material, the method further comprising subjecting one or more of the fuses to appropriate energy to blow said one or more of the fuses, the blowing of said one or more of the fuses comprising disrupting first material associated with said one or more of the fuses and disrupting second material associated with said one or more of the fuses.

6. The method of claim 1 wherein the arrangement of the fuses is configured so that no fuse becomes electrically isolated in the plate when its neighboring fuses are blown.

7. The method of claim 1 wherein the electrically conductive plate comprises a stack of electrically conductive materials.

8. The method of claim 1 wherein one or more of the electrically conductive links comprises a stack of electrically conductive materials.

9. The method of claim 1 wherein the electrically conductive plate and one or more of the electrically conductive links comprise the same composition as one another.

10. The method of claim 1 wherein the electrically conductive plate comprises a different composition than one or more of the electrically conductive links.

11. The method of claim 1 wherein the electrically conductive plate comprises one or more of aluminum, copper, gold, silver, tungsten, titanium and silicon.

12. The method of claim 1 wherein the electrically conductive plate comprises one or both of titanium nitride and tungsten nitride.

13. The method of claim 1 wherein the electrically conductive plate comprises at least one metal silicide.

14. A method of forming a semiconductor fuse arrangement, comprising:

providing a semiconductor substrate;

forming a plurality of electrically conductive interconnects over the substrate;

forming electrically insulative material over the electrically conductive interconnects;

forming a plurality of openings extending through the electrically insulative material and to the electrically conductive interconnects;

forming a plurality of electrically conductive links within the openings and in electrical connection with the electrically conductive interconnects; and forming an electrically conductive plate over the insulative material and in electrical connection with the electrically conductive links, each location where one of the links makes electrical contact to the electrically conductive plate being a fuse.

15. The method of claim 14 wherein the electrically conductive plate is formed after the links are formed within the openings.

16. The method of claim 14 wherein the electrically conductive plate is formed prior to forming the openings though the electrically insulative material.

17. The method of claim 14 wherein the electrically conductive plate comprises a material, and further comprising subjecting one or more of the fuses to appropriate energy to blow said one or more of the fuses, the blowing of said one or more of the fuses comprising disrupting material of the electrically conductive plate which is associated with said one or more of the fuses.

18. The method of claim 17 wherein the disrupting of the material of the electrically conductive plate comprises melting said material.

19. The method of claim 17 wherein the disrupting of the material of the electrically conductive plate comprises vaporizing said material.

20. The method of claim 14 wherein the electrically conductive plate comprises a first material and the links comprise a second material which can be the same as the first material or different from the first material, the method further comprising subjecting one or more of the fuses to appropriate energy to blow said one or more of the fuses, the blowing of said one or more of the fuses comprising disrupting first material associated with said one or more of the fuses and disrupting second material associated with said one or more of the fuses.

21. The method of claim 14 wherein the arrangement of the fuses is configured so that no fuse becomes electrically isolated in the plate when its neighboring fuses are blown.

22. The method of claim 14 wherein one or more of the electrically conductive links comprises a stack of electrically conductive materials.

23. The method of claim 14 wherein the electrically conductive plate comprises a stack of electrically conductive materials.

24. The method of claim 14 wherein the electrically conductive plate and all of the electrically conductive links comprise the same composition as one another.

25. The method of claim 14 wherein the electrically conductive plate comprises a different composition than any of the electrically conductive links.

26. The method of claim 14 wherein the electrically conductive plate comprises one or more of aluminum, copper, gold, silver, tungsten, titanium and silicon.

27. The method of claim 14 wherein the electrically conductive plate comprises one or both of titanium nitride and tungsten nitride.

28. The method of claim 14 wherein the electrically conductive plate comprises at least one metal silicide.

* * * * *